United States Patent
Bong et al.

(10) Patent No.: US 11,335,247 B2
(45) Date of Patent: May 17, 2022

(54) PIXEL CIRCUIT, LIGHT EMITTING DISPLAY DEVICE, AND DRIVING METHOD THEREOF

(71) Applicant: LG Display Co., Ltd., Seoul (KR)

(72) Inventors: Junho Bong, Paju-si (KR); Minwoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/121,059

(22) Filed: Dec. 14, 2020

(65) Prior Publication Data
US 2021/0201766 A1 Jul. 1, 2021

(30) Foreign Application Priority Data
Dec. 30, 2019 (KR) .................. 10-2019-0178663

(51) Int. Cl.
| | | |
|---|---|---|
| *G09G 3/30* | (2006.01) | |
| *G09G 3/32* | (2016.01) | |
| *H01L 27/32* | (2006.01) | |
| *H01L 29/786* | (2006.01) | |
| *H01L 27/12* | (2006.01) | |

(52) U.S. Cl.
CPC .......... *G09G 3/32* (2013.01); *H01L 27/3262* (2013.01); *H01L 27/3265* (2013.01); *H01L 27/3276* (2013.01); *G09G 2300/0426* (2013.01); *G09G 2300/0439* (2013.01); *G09G 2310/0267* (2013.01); *G09G 2310/0275* (2013.01); *H01L 27/124* (2013.01); *H01L 27/1225* (2013.01); *H01L 27/1255* (2013.01); *H01L 29/7869* (2013.01)

(58) Field of Classification Search
CPC .. G09G 3/32; G09G 3/30; G09G 3/34; G09G 2300/0426; G09G 2300/0439; G09G 2310/0267; G09G 2310/0275; H01L 27/3262; H01L 27/3265; H01L 27/3276; H01L 27/1225; H01L 27/1255; H01L 29/7869
See application file for complete search history.

(56) References Cited

U.S. PATENT DOCUMENTS

| | | | |
|---|---|---|---|
| 10,943,970 B2* | 3/2021 | Jo ..................... | H01L 27/3279 |
| 2015/0243721 A1* | 8/2015 | Jeon .................. | H01L 27/3262 |
| | | | 257/40 |
| 2016/0233281 A1* | 8/2016 | Yoon ................. | H01L 27/1225 |
| 2018/0122880 A1* | 5/2018 | Lee ................... | H01L 27/1255 |
| 2018/0226023 A1* | 8/2018 | Park .................. | G09G 3/3233 |

(Continued)

*Primary Examiner* — Pegeman Karimi
(74) *Attorney, Agent, or Firm* — Fenwick & West LLP (57) ABSTRACT

A light emitting display device includes a pixel circuit including: a first transistor having a first electrode connected to a first node coupled to a first power supply line, a second electrode connected to a second node, and a gate electrode connected to a third node; a second transistor having a first electrode connected to the first node, a second electrode connected to the third node, and a gate electrode connected to a first gate line; a light emitting diode connected to the first transistor; a first capacitor having a first electrode connected to the third node and a second electrode connected to a conductive line and an anode electrode of the light emitting diode; and a second capacitor having a first electrode connected to the third node and a second electrode connected to a constant voltage source which supplies a DC voltage.

22 Claims, 9 Drawing Sheets

(56) References Cited

U.S. PATENT DOCUMENTS

2019/0180675 A1* 6/2019 Jang .................. G09G 3/32
2019/0326348 A1* 10/2019 Im ...................... G09G 3/32
2020/0402466 A1* 12/2020 Park .................. G09G 3/3266

* cited by examiner

PIXEL CIRCUIT, LIGHT EMITTING DISPLAY DEVICE, AND DRIVING METHOD THEREOF

CROSS REFERENCE TO RELATED APPLICATION

This application claims priority from Korean Patent Application No. 10-2019-0178663, filed on Dec. 30, 2019, which is hereby incorporated by reference for all purposes as if fully set forth herein.

BACKGROUND

Field of the Invention

The present disclosure relates to a pixel circuit, a light emitting display device, and a driving method thereof and more particularly to a pixel circuit, a light emitting display device, and a driving method thereof that can improve image quality.

Discussion of the Related Art

With advancement in information-oriented societies, requirements for display devices displaying an image have increased in various types, and various types of display devices such as a liquid crystal display device (LCD), a quantum dot light emitting display device (QLED), and a light emitting display device have been widely utilized in recent years.

In a light emitting display device among these display devices, a light emitting diode which is supplied with a drive current emits light, and such a light emitting display device is widely used due to an excellent viewing angle and a high response speed thereof. A light emitting display device can be embodied with a small thickness.

SUMMARY OF THE INVENTION

However, such a light emitting display device has a problem with a decrease in image quality due to unevenness in threshold voltage of drive transistors. When the threshold voltages of the drive transistors in the light emitting display device are compensated for, but voltages of gate electrodes of the drive transistors fluctuate, an amount of current flowing in light emitting diodes is not constant and thus in image quality may decrease. Accordingly, it is necessary to prevent a voltage of a gate electrode of a drive transistor from fluctuating.

Disclosed is a pixel circuit, a light emitting display device, and a driving method thereof with a new structure for the purpose of prevention of a decrease in image quality.

An embodiment of the present disclosure provides a pixel circuit, a light emitting display device, and a driving method thereof in which a threshold voltage of a drive transistor can be compensated for.

An embodiment of the present disclosure provides a pixel circuit, a light emitting display device, and a driving method thereof that can prevent a voltage of a gate electrode of a drive transistor from fluctuating due to a kickback phenomenon.

The present disclosure is not limited to the above-mentioned objectives and other objectives which have not been mentioned above will be able to be apparently understood from the following description by those skilled in the art.

According to an embodiment of the present disclosure, there is provided a pixel circuit including: a first transistor having a first electrode connected to a first node which is coupled to a first power supply line supplying a first source voltage, a second electrode connected to a second node, and a gate electrode connected to a third node; a second transistor having a first electrode connected to the first node, a second electrode connected to the third node, and a gate electrode connected to a first gate line; a light emitting diode coupled to the first transistor; a first capacitor having a first electrode connected to the third node and a second electrode connected to a conductive line and an anode electrode of the light emitting diode, the conductive line coupled to a second power supply line supplying an initialization voltage; and a second capacitor having a first electrode connected to the third node and a second electrode connected to a constant voltage source which supplies a DC voltage.

According to an embodiment of the present disclosure, there is provided a light emitting display device including: a display panel that includes a plurality of data lines, a plurality of gate lines, a plurality of emission lines, and a plurality of pixels which are connected to the plurality of data lines, the plurality of gate lines, and the plurality of emission lines; a data driver that supplies a data signal to the plurality of data lines; a gate driver that supplies a gate signal to the plurality of gate lines and supplies an emission signal to the plurality of emission lines; and a timing controller that controls the data driver and the gate driver, wherein each pixel includes a first transistor having a first electrode connected to a first node which is coupled to a first power supply line supplying a first source voltage, a second electrode connected to a second node, and a gate electrode connected to a third node, a second transistor having a first electrode connected to the first node, a second electrode connected to the third node, and a gate electrode connected to a first gate line, a light emitting diode coupled to the first transistor, a first capacitor having a first electrode connected to the third node and a second electrode connected to a conductive line and an anode electrode of the light emitting diode, the conductive line coupled to a second power supply line supplying an initialization voltage, and a second capacitor having a first electrode connected to the third node and a second electrode connected to a constant voltage source which supplies a DC voltage.

According to an embodiment of the present disclosure, there is provided a light emitting display device including: a substrate; a semiconductor layer that is disposed on the substrate; a gate insulating film that is disposed on the semiconductor layer; a gate electrode that is disposed to overlap the semiconductor layer on the gate insulating film; an interlayer insulating film that is disposed on the gate electrode; a first power supply line that is disposed on the interlay insulating film and supplies a first source voltage, at least a part of the first power supply line overlapping the gate electrode; a source electrode that is disposed on the interlayer insulating film and is in contact with the semiconductor layer via a first contact hole; a drain electrode that is disposed on the interlayer insulating film and is in contact with the semiconductor layer via a second contact hole; a protection layer that is disposed on the first power supply line, the source electrode, and the drain electrode; and a conductive film that is disposed on the protection layer, at least a part of the conductive film overlapping the gate electrode.

According to an embodiment of the present disclosure, there is provided a method of driving a light emitting display device including a plurality of pixels, in each of the pixels, a drive current is supplied to a light emitting diode in response to a voltage which is applied to a gate electrode of a first transistor, the method including: initializing the pixel; writing a data voltage to the pixel; sampling a threshold voltage of the first transistor; and supplying the drive current to the light emitting diode, wherein the gate electrode of the first transistor is capacitively coupled to a constant voltage source that supplies a DC voltage.

With the pixel circuit, the light emitting display device, and the driving method thereof according to the embodiments of the present disclosure, it is possible to improve image quality.

The present disclosure is not limited to the above-mentioned advantages and other advantages which have not been mentioned above will be able to be apparently understood from the following description by those skilled in the art.

DETAILED DESCRIPTION OF THE INVENTION

Advantages and features of the invention and methods for achieving the advantages or features will be apparent from embodiments described below in detail with reference to the accompanying drawings. However, the invention is not limited to the embodiments but can be modified in various forms. The embodiments are provided merely for completing the disclosure of the invention and are provided for completely informing those skilled in the art of the scope of the invention. The scope of the invention is defined by only the appended claims.

Shapes, sizes, ratios, angles, number of pieces, and the like illustrated in the drawings, which are provided for the purpose of explaining the embodiments of the invention, are exemplary and thus the invention is not limited to the illustrated details. In the following description, like elements are referenced by like reference numerals. When it is determined that detailed description of the relevant known functions or configurations involved in the invention makes the gist of the invention obscure, the detailed description thereof will not be made. When "include," "have," "be constituted," and the like are mentioned in the specification, another element may be added unless "only" is used. A singular expression of an element includes two or more elements unless differently mentioned.

In construing elements, an error range is included even when explicit description is not made.

For example, when positional relationships between two parts are described using 'on,' 'over,' 'under,' 'beside,' and the like, one or more other parts may be disposed between the two parts unless 'just' or 'direct' is used.

In describing temporal relationships, for example, when the temporal order is described using 'after,' 'subsequent,' 'next,' and 'before,' a case which is not continuous may be included unless 'just' or 'direct' is used.

In describing signal transmission relationships, for example, when 'a signal is transmitted from node A to node B,' a case in which the signal is transmitted from node A to node B via another node may be included unless 'just' or 'direct' is used.

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features (elements) of embodiments of the invention can be coupled or combined with each other or separated from each other partially or on the whole and can be technically interlinked and driven in various forms. The embodiments may be put into practice independently or in combination.

Figure 1:
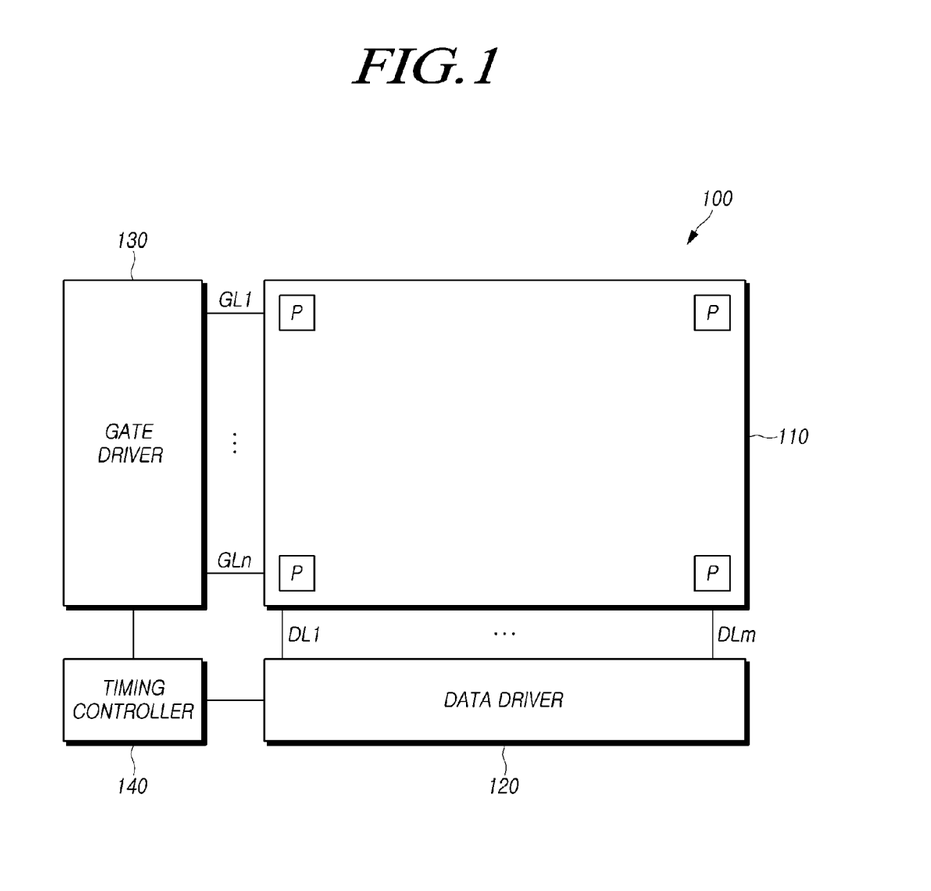
FIG. 1 is a diagram illustrating a structure of a light emitting display device according to an embodiment of the present disclosure.

FIG. 1 is a diagram illustrating a structure of a light emitting display device according to an embodiment of the present disclosure.

Referring to FIG. 1, a light emitting display device 100 includes a display panel 110, a data driver 120, a gate driver 130, and a timing controller 140.

The display panel 110 includes a plurality of data lines DL1 to DLm that extend in a first direction and a plurality of gate lines GL1 to GLn that extend in a second direction. The first direction and the second direction are perpendicular to each other, but the present disclosure is not limited thereto.

The display panel 110 further includes a plurality of pixels 101. The plurality of pixels 101 are connected to the plurality of data lines DL1 to DLm and the plurality of gate lines GL1 to GLn. Each pixel 101 operates in response to supply of a data signal which is transmitted thereto via the corresponding data line in response to a gate signal which is transmitted via the corresponding gate line.

The data driver 120 is connected to the plurality of data lines DL1 to DLm and supplies a data signal to a plurality of pixels 101 via the plurality of data lines DL1 to DLm. The data driver 120 includes a plurality of source drivers. Each of the plurality of source drivers can be embodied by an integrated circuit. The data signal which is transmitted by the data driver 120 is applied to the pixels.

The gate driver 130 is connected to the plurality of gate lines GL1 to GLn and supplies a gate signal to the plurality of gate lines GL1 to GLn. A pixel 101 which is supplied with the gate signal via the corresponding gate line can be supplied with a data signal supplied via a corresponding data line.

In FIG. 1, the gate driver 130 is disposed outside the display panel 110, but the present disclosure is not limited thereto. The gate driver 130 may include a gate signal generating unit that is disposed in the display panel 110. The gate driver 130 can be embodied by a plurality of integrated circuits.

Additionally, in FIG. 1, the gate driver 130 is disposed on one side of the display panel 110, but the present disclosure is not limited thereto. The gate driver 130 may be disposed on both sides of the display panel 110, the gate driver disposed on the left side may be connected to odd-numbered gate lines, and the gate driver disposed on the right side may be connected to the even-numbered gate lines.

The timing controller 140 controls the data driver 120 and the gate driver 130. The timing controller 140 supplies a data control signal to the data driver 120 and supplies a gate control signal to the gate driver 130. The data control signal and the gate control signal include a vertical synchronization signal, a horizontal synchronization signal, and a start pulse. Signals which are output from the timing controller 140 are not limited thereto.

The timing controller 140 supplies an image signal to the data driver 120. The data driver 120 generates a data signal based on the image signal and the data control signal which are supplied thereto, and supplies the generated data signal to the plurality of data lines.

Figure 2:
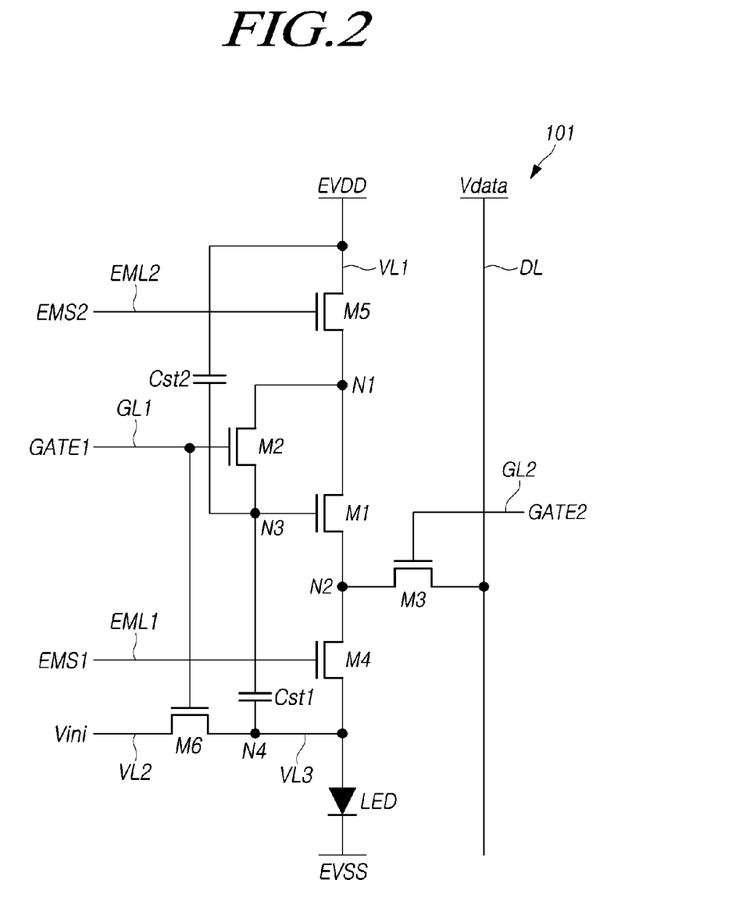
FIG. 2 is a circuit diagram illustrating a pixel according to an embodiment of the present disclosure.

FIG. 2 is a circuit diagram illustrating a pixel 101 according to an embodiment of the present disclosure.

Referring to FIG. 2, a pixel 101 includes a first transistor M1, a second transistor M2, a light emitting diode LED, a first capacitor Cst1, and a second capacitor Cst2.

The first transistor M1 includes a first electrode connected to a first node N1 which is supplied with a first source voltage EVDD, a second electrode connected to a second node N2, and a gate electrode connected to a third node N3. The first transistor M1 supplies a drive current from the first node N1 to the second node N2 in response to a voltage which is applied to the gate electrode. The second node N2 is supplied with a voltage corresponding to a data signal Vdata. The first transistor M1 is a drive transistor that generates a drive current.

The second transistor M2 includes a first electrode connected to the first node N1, a second electrode connected to the third node N3, and a gate electrode connected to the first gate line GL1. The first gate line provides a first gate signal GATE1. When the second transistor M2 is turned on, the first node N1 is connected to the third node N3.

The light emitting diode LED is coupled to the first transistor M1. The light emitting diode LED emits light in response to a drive current supplied from the first transistor M1. The light emitting diode LED includes an anode electrode, a cathode electrode, and a light emitting layer that is disposed between the anode electrode and the cathode electrode. The light emitting layer is disposed between the anode electrode and the cathode electrode and emits light in response to a drive current. The light emitting layer includes at least one film, which may be an organic film or an inorganic film.

The first capacitor Cst1 includes a first electrode connected to the third node N3 and a second electrode connected to a conductive line VL3 which is supplied with an initialization voltage Vini. The first capacitor Cst1 stores the voltage of the third node N3.

The first capacitor Cst1 is initialized with the initialization voltage Vini. The conductive line VL3 is connected to the anode electrode of the light emitting diode LED. The conductive line VL3 may be a portion of an anode electrode of the light emitting diode LED. The anode electrode of the light emitting diode LED is initialized with the initialization voltage Vini.

The second capacitor Cst2 includes a first electrode connected to the gate electrode of the first transistor M1 and a second electrode connected to a constant voltage source that supplies a DC voltage. When the second transistor M2 is turned on or turned off, the voltage of the third node N3 can fluctuate due to a kickback phenomenon. When the voltage of the third node N3 fluctuates, an amount of drive current supplied from the first transistor M1 may fluctuate and image quality of the light emitting display device 100 may decrease. For the purpose of preventing this problem, it is possible to curb fluctuation of voltage of the third node N3 due to a kickback phenomenon by disposing the second capacitor Cst2 that is connected between a constant voltage source supplying a DC voltage and the third node N3. The constant voltage source connected to the second capacitor Cst2 may supply a first source voltage EVDD. However, the present disclosure is not limited thereto.

The pixel 101 further includes a third transistor M3, a fourth transistor M4, a fifth transistor M5, and a sixth transistor M6.

The third transistor M3 includes a first electrode connected to the second node N2, a second electrode connected to the data line DL, and a gate line connected to the second gate line GL2. The second gate line GL2 provides a second gate signal GATE2. When the third transistor M3 is turned on, the data signal Vdata which is supplied to the data line DL can be transmitted to the second node N2.

The fourth transistor M4 includes a first electrode connected to the second node N2, a second electrode connected to the light emitting diode LED, and a gate electrode connected to the first emission line EML1. The first emission line EML1 provides a emission signal EMS1. When the fourth transistor M4 is turned on, the second node N2 is connected to the anode electrode of the light emitting diode LED, and the first transistor M1 is connected to the light emitting diode LED. When the fourth transistor M4 is turned on, a drive current flowing in the second node N2 is supplied to the light emitting diode LED.

The fifth transistor M5 includes a first electrode connected to the first power supply line VL1, a second electrode connected to the first node N1, and a gate electrode connected to the second emission line EML2. The first power supply line VL1 supplies a first voltage source EVDD. The second emission line EML2 provides a second emission signal EMS2. The fifth transistor M5 selectively connects the first power supply line VL1 supplying the first source voltage EVDD to the first node N1. When the first power supply line VL1 is connected to the first node N1 and the first transistor M1 is turned on by a voltage applied to the third node N3, the first transistor M1 allows a drive current to flow from the first node N1 to the second node N2.

The sixth transistor M6 includes a first electrode connected to the second power supply line VL2, a second electrode connected to a fourth node N4, and a gate electrode connected to the first gate line GL1. The second power supply line VL2 supplies the initialization voltage Vini. The sixth transistor M6 selectively connects the fourth node N4 to the second power supply line VL2 supplying the initialization voltage Vini to initialize the fourth node N4 with the initialization voltage Vini. The fourth node N4 is connected to the light emitting diode LED and the second electrode of the first capacitor Cst1. The fourth node N4 is connected to the anode electrode of the light emitting diode LED. The initialization voltage Vini supplied to the fourth node N4 can initialize the voltage applied to the anode electrode of the light emitting diode LED and the voltage applied to the second electrode of the first capacitor Cst1.

In the embodiment illustrated in FIG. 2, the first to sixth transistors M1 to M6 are NMOS transistors, but the present disclosure is not limited thereto. At least one thereof may be a PMOS transistor. Moreover, at least the second transistor M2 out of the first to sixth transistors M1 to M6 may include oxide semiconductor.

When a transistor includes oxide semiconductor, an amount of leakage current is reduced. Accordingly, when the second transistor M2 includes oxide semiconductor, it is possible to prevent the voltages stored in the first capacitor Cst1 and the second capacitor Cst2 from flowing through the second transistor M2 and thus to curb fluctuation of the voltage of the third node N3. When the first transistor M1 and the third to sixth transistors M3 to M6 include oxide semiconductor, an amount of leakage current further decreases.

Figure 3:
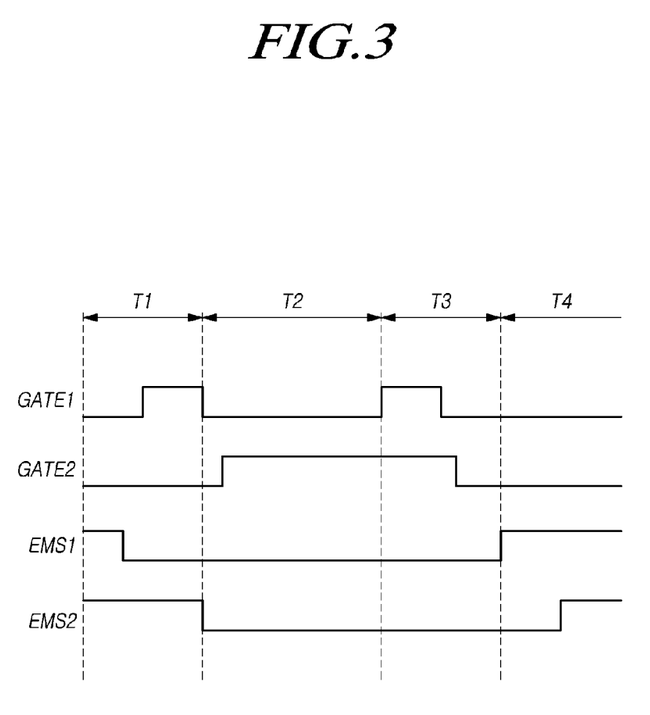
FIG. 3 is a timing diagram illustrating an operation of the pixel illustrated in FIG. 2.

FIG. 3 is a timing diagram illustrating an operation of the pixel 101 illustrated in FIG. 2.

Referring to FIG. 3, the pixel 101 can operate separately in an initialization period T1, a writing period T2, a sampling period T3, and an emission period T4. In the initialization period T1, the pixel 101 is initialized. In the writing period T2, a data signal Vdata is written to the pixel 101. In the sampling period T3, the threshold voltage of the first transistor M1 is stored. In the emission period T4, the light emitting diode LED can be supplied with a drive current and emit light.

The pixel 101 can be supplied with a first gate signal GATE1 via the first gate line GL1 and supplied with a second gate signal GATE2 via the second gate line GL2. The pixel 101 is supplied with a first emission signal EMS1 via the first emission line EML1 and supplied with a second emission signal EMS2 via the second emission line EML2.

In the initialization period T1, the first gate signal GATE1 is switched to a high state and the second gate signal GATE2 is maintained in a low state. In the initialization period T1, the first emission signal EMS1 is switched to the low state and the second emission signal EMS2 is maintained in the high state.

In the initialization period T1, after the fifth transistor M5 is turned on by the second emission signal EMS2, the second transistor M2 and the sixth transistor M6 are turned on by the first gate signal GATE1. The third transistor M3 is maintained in an OFF state by the second gate signal GATE2, and the fourth transistor M4 is turned off by the first emission signal EMS1.

In the initialization period T1, when the first transistor M5 is turned on, the first source voltage EVDD is transmitted to the first node N1. When the second transistor M2 and the sixth transistor M6 are turned on, the first node N1 and the third node N3 are connected to each other and the first source voltage EVDD is transmitted to the third node N3. Accordingly, the first source voltage EVDD is transmitted to the first electrode of the first capacitor Cst1. When the sixth transistor M6 is turned on, the initialization voltage Vini is transmitted to the fourth node N4.

In the initialization period T1, the initialization voltage Vini is transmitted to the anode electrode of the light emitting diode LED. In some embodiments, the voltage level of the initialization voltage Vini is lower than the threshold voltage of the light emitting diode LED such that the light emitting diode LED does not emit light.

In the writing period T2, the first gate signal GATE1 is switched to the low state and the second gate signal GATE2 is switched to the high state. In the writing period T2, the first emission signal EMS1 is maintained in the low state and the second emission signal EMS2 is switched to the low state.

In the writing period T2, after the second transistor M2 and the sixth transistor M6 are turned off by the first gate signal GATE1, the fifth transistor M5 is turned off by the second emission signal EMS2. In the writing period T2, the third transistor M3 is turned on by the second gate signal GATE2, and the fourth transistor M4 is maintained in the OFF state by the first emission signal EMS1.

In the writing period T2, when the second transistor M2 is turned off, the first node N1 and the third node N3 are disconnected from each other. Then, when the third transistor M3 is turned on, the data signal Vdata supplied to the data line DL is written to the second node N2. During the writing period T2, the fourth transistor M4 is maintained in the OFF state and a drive current does not flow in the light emitting diode LED.

In the sampling period T3, the first gate signal GATE1 is switched to the high state and the second gate signal GATE2 is maintained in the high state. In the sampling period T3, the first emission signal EMS1 and the second emission signal EMS2 are maintained in the low state.

In the sampling period T3, the second transistor M2 and the sixth transistor M6 are turned on by the first gate signal GATE1, the third transistor M3 is maintained in the ON state by the second gate signal GATE2, and the fourth transistor M4 and the fifth transistor M5 are maintained in the OFF state by the first emission signal EMS1 and the second emission signal EMS2.

In the sampling period, the third transistor M3 is maintained in the ON state and the data signal Vdata supplied to the data line DL continues to be supplied to the second node N2. Then, when the second transistor M2 and the sixth transistor M6 are turned on, the first node N1 and the third node N3 are connected to each other and the initialization voltage Vini is transmitted to the fourth node N4. The third transistor M3 is maintained in the ON state and the second node N2 is connected to the data line DL.

When the voltage level of the first source voltage EVDD is stored in the third node N3 by the first capacitor Cst1 and the data line is connected to the second node N2, a current flows from the third node N3 to the second node N2 via the first node N1. Accordingly, a voltage corresponding to the data signal Vdata and a voltage corresponding to the threshold voltage of the first transistor M1 are stored in the third node N3 as represented by Expression 1.

$$Vn3 = Vdata + Vth \qquad \text{(Expression 1)}$$

Here, Vn3 denotes the voltage applied to the third node N3, Vdata denotes the voltage level of the data signal, and Vth denotes the threshold voltage of the first transistor M1.

In the sampling period T3, after the voltage corresponding to Expression 1 is stored in the third node N3, the first emission signal EMS1 and the second emission signal EMS2 are maintained in the low state, and the first gate signal GATE1 and the second gate signal GATE2 are switched to the low state. When the first gate signal GATE1 and the second gate signal GATE2 are switched to the low state, the voltage corresponding to Expression 1 is maintained by the first capacitor Cst1.

In the emission period T4, in a state in which the first gate signal GATE1 and the second gate signal GATE2 are maintained in the low state, the first emission signal EMS1 and the second emission signal EMS2 are sequentially switched to the high state. When the first emission signal EMS1 and the second emission signal EMS2 are sequentially switched to the high state, the fourth transistor M4 and the fifth transistor M5 are sequentially turned on, the first transistor M1 allows a drive current to flow from the first node N1 to the second node N2 in response to the voltage applied to the third node N3, and the drive current is supplied to the light emitting diode LED via the fourth transistor M4.

In the sampling period T3, the second transistor M2 is turned off after the sampling of the threshold voltage of the first switch M1 is completed, and the third node N3 is switched to a floating state by the turning-off of the second transistor M2. When the third node N3 is switched to the floating state, the voltage level of the third node N3 becomes unstable. Then, when a kickback phenomenon occurs due to the turning-off of the second transistor M2, the voltage level of the third node N3 decreases. In the emission period T4, when the fifth transistor M5 is turned on, a kickback phenomenon occurs due to the turning-on of the fifth transistor M5 and the voltage level of the third node N3 increases. When the voltage level of the third node N3 increases or decreases, the image quality of the light emitting display device 100 may decrease as a result.

In order to alleviate the above problem, when the second capacitor Cst2 connected to the constant voltage source is connected to the third node N3, the voltage level of the third node N3 is fixed to the constant voltage and thus it is possible to prevent fluctuation of the voltage level of the third node N3 due to the kickback phenomenon. The constant voltage source connected to the second capacitor Cst2 may provide the first source voltage EVDD.

Figure 4:
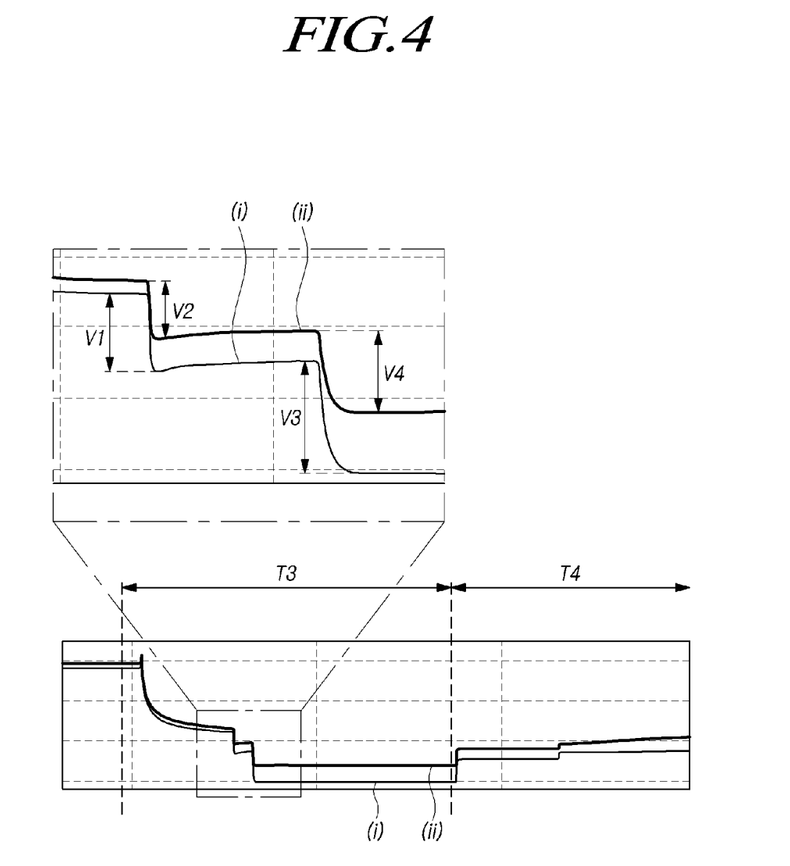
FIG. 4 is a graph illustrating change of a voltage of a third node in a sampling period and an emission period illustrated in FIG. 3.

FIG. 4 is a graph illustrating fluctuation of the voltage of the third node in the sampling period and the emission period in FIG. 3.

Referring to FIG. 4, waveform (i) represents the voltage of the third node when the second capacitor Cst2 is not connected to the third node N3, and waveform (ii) represents the voltage of the third node when the second capacitor Cst2 is connected to the third node N3.

In the sampling period T3, the voltage level of the third node N3 decreases from the voltage level of the first source voltage EVDD to the voltage corresponding to Expression 1. At this time, the voltage level of the third node N3 decreases due to the kickback phenomenon which occurs by sequentially turning off the second transistor M2 and the third transistor M3.

In the emission period T4, the voltage level of the third node N3 increases due to the kickback phenomenon on which occurs by sequentially turning on the fourth transistor M4 and the fifth transistor M5.

During the sampling period T3, changes V2 and V4 of the voltage of the third node N3 in (ii) are less than changes V1 and V3 of the voltage of the third node N3 in (i). That is, when the second capacitor Cst2 is connected to the third node N3, it can be seen that a fluctuation range of the voltage level of the third node N3 decreases in comparison with a case in which the second capacitor Cst2 is not connected to the third node N3.

Figure 5A:
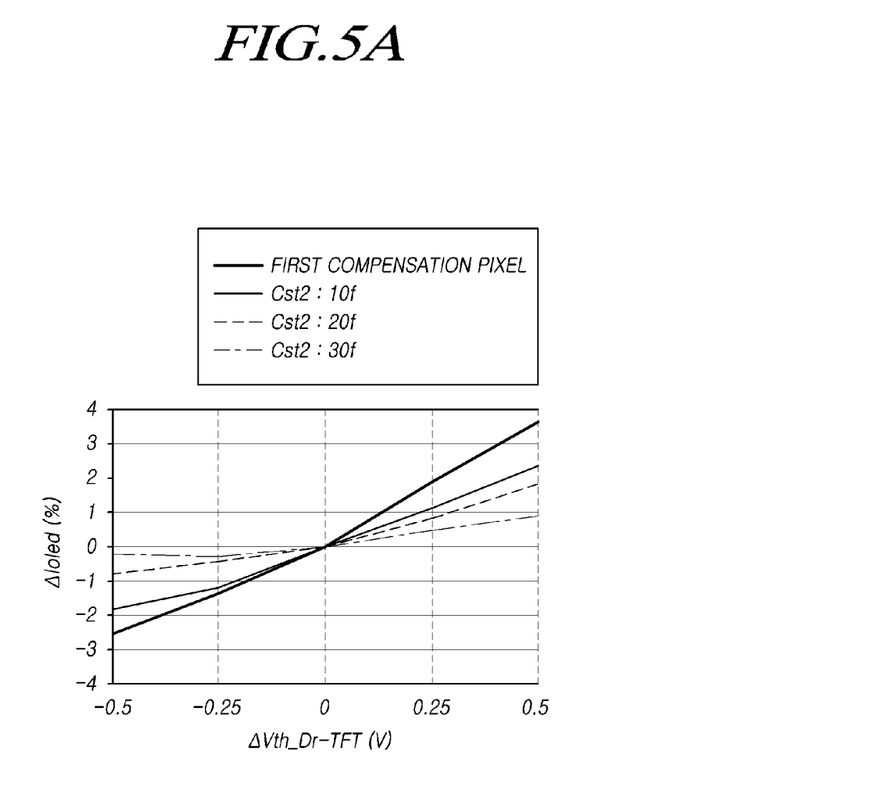
FIGS. 5A and 5B are graphs illustrating change of a drive current depending on element characteristics of the pixel illustrated in FIG. 2.
Figure 5B:
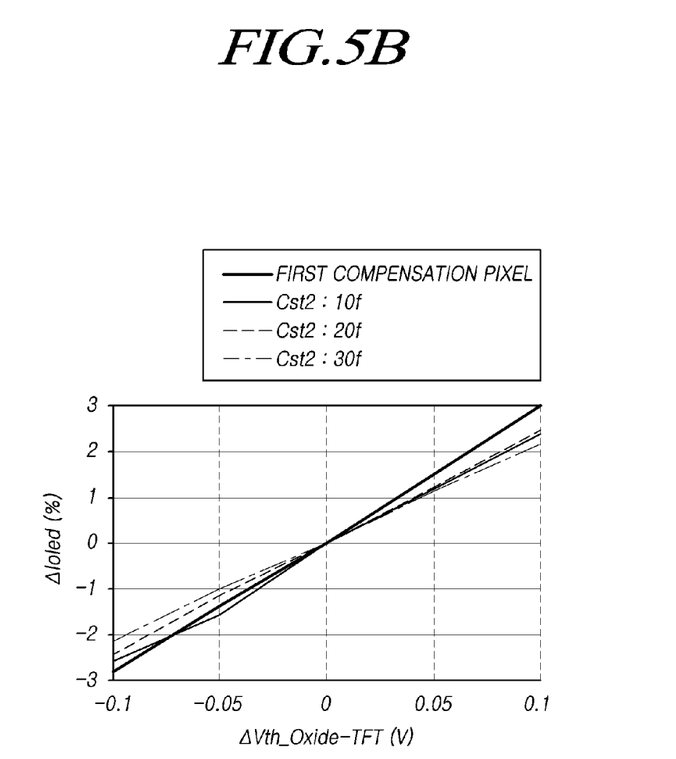

FIGS. 5A and 5B are graphs illustrating changes of a drive current depending on element characteristics of the pixel illustrated in FIG. 2.

The semiconductor layer of the second transistor M2 out of the first to sixth transistors M1 to M6 in FIG. 2 includes oxide semiconductor, and the semiconductor layers of the first transistor M1 and the third to sixth transistors M3 to M6 include low-temperature polysilicon. In FIGS. 5A and 5B, a first compensation pixel represents that the second capacitor Cst2 is not connected in the pixel illustrated in FIG. 2. FIG. 5A illustrates a graph which is measured in a state in which characteristics such as the threshold voltage of the second transistor M2 are fixed, and FIG. 5B illustrates a graph which is measured in a state in which characteristics such as the threshold voltage of the first transistor M1 are fixed.

Referring to FIG. 5A, the magnitude of the drive current changes depending on changes of the threshold voltage of the first transistor M1 and the capacity of the second capacitor Cst2. Particularly, an amount of change of the drive current decreases as the capacity of the second capacitor Cst2 increases.

Referring to FIG. 5B, the magnitude of the drive current changes depending on changes of the threshold voltage of the second transistor M2 and the capacity of the second capacitor Cst2. Particularly, an amount of change of the drive current decreases as the capacity of the second capacitor Cst2 increases.

Accordingly, when the second capacitor Cst2 is connected to the third node N3 of the pixel illustrated in FIG. 2, the drive current flows more stably. Accordingly, it is possible to improve image quality of the light emitting display device 100.

Figure 6A:
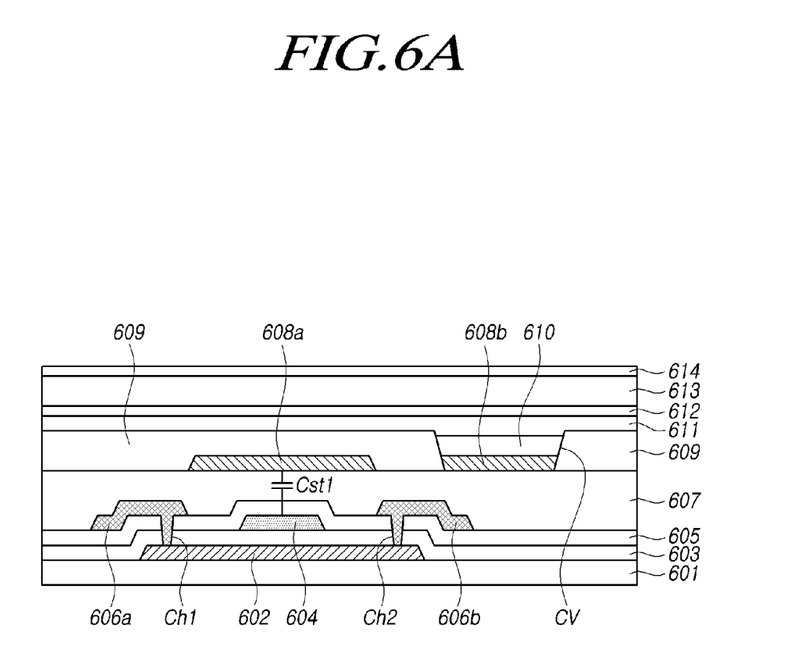
FIGS. 6A and 6B are diagrams illustrating cross-sections of a light emitting display device according to an embodiment of the present disclosure.
Figure 6B:
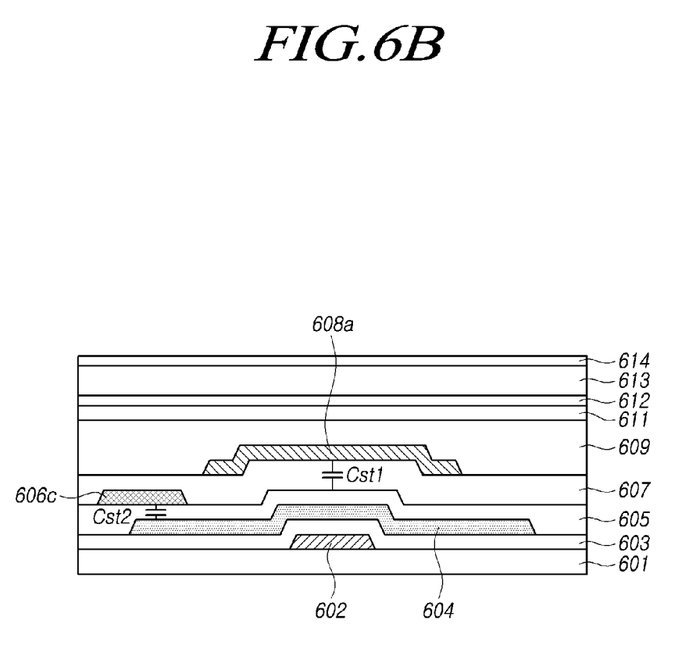

FIGS. 6A and 6B are diagrams illustrating cross-sections of a light emitting display device according to an embodiment of the present disclosure.

FIGS. 6A and 6B illustrate cross-sections, which are perpendicular to each other, of a part in which the semiconductor layer of the first transistor M1 is disposed.

Referring to FIGS. 6A and 6B, the light emitting display device 100 includes a substrate 601, a semiconductor layer 602 that is disposed on the substrate 601, a gate insulating film 603 that is disposed on the semiconductor layer 602, a gate electrode 604 that is disposed to overlap the semiconductor layer 602 on the gate insulating film 603, an interlayer insulating film 605 that is disposed on the gate electrode 604, a conductive layer 606c that is disposed on the interlayer insulating film 605 and of which at least a part overlaps the gate electrode 604, a source electrode 606a that is disposed on the interlayer insulating film 605 and is in contact with the semiconductor layer 602 via a first contact hole ch1, a drain electrode 606b that is disposed on the interlayer insulating film 605 and is in contact with the semiconductor layer 602 via a second contact hole ch2, a protective layer 607 that is disposed on the conductive layer 606c, the source electrode 606a, and the drain electrode 606b, and a conductive film 608a that is disposed on the protective layer 607 and of which at least a part overlaps the gate electrode 604.

The substrate 601 is transparent and is formed of, for example, glass, plastic, or polyethylene terephthalate (PET). When the substrate 601 is formed of plastic, the substrate 601 is flexible. The semiconductor layer 602 is formed of low-temperature polysilicon or oxide semiconductor.

At least a part of the conductive layer 606c and the gate electrode 604 overlap to form the second capacitor Cst2 illustrated in FIG. 2. At least a part of the conductive film 608a and the gate electrode 604 overlap to form the first capacitor Cst1 illustrated in FIG. 2. Accordingly, the gate electrode 604 is capacitively coupled to the constant voltage source providing the first source voltage EVDD via the conductive layer 606c. Accordingly, even when the gate electrode 604 is in the floating state, the first source voltage EVDD which is supplied via the conductive layer 606c may prevent the voltage of the gate electrode 604 from fluctuating.

The anode electrode 608b is disposed on the protective layer 607, and the anode electrode 608b and the conductive film 608a are connected to each other. The conductive film 608a corresponds to the conductive line VL3 connected to the fourth node N4 illustrated in FIG. 2.

A bank 609 with a cavity CV is formed on the protective layer 607 on which the anode electrode 608b and the conductive film 608a are disposed, and the anode electrode 608b is disposed in the cavity CV. A light emitting layer 610 is disposed on the anode electrode 608b in the cavity CV. A cathode electrode 611 is disposed on the light emitting layer 610 and the bank 609.

Encapsulation layers 612, 613, and 614 are disposed on the cathode electrode 611. The encapsulation layers 612, 163, and 614 include a first inorganic film 612, an organic film 613, and a second inorganic film 614. The organic film 613 is thicker than the first inorganic film 612 and the second inorganic film 614. The encapsulation layers 612, 613, and 614 can prevent foreign substance or moisture from permeating the light emitting layer 610.

Figure 7:
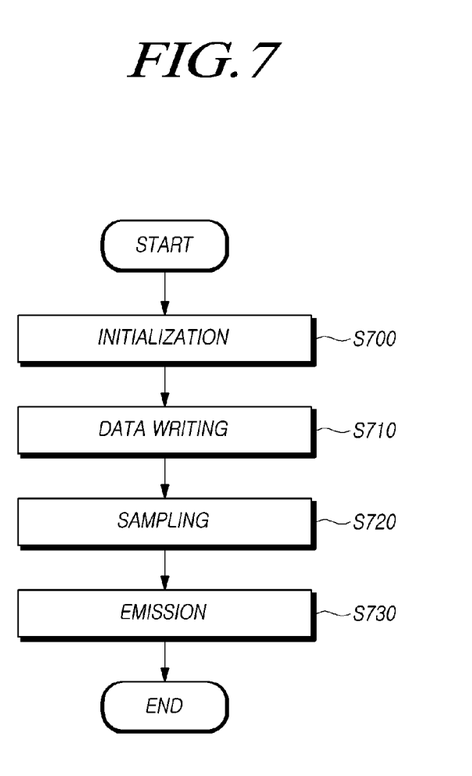
FIG. 7 is a flowchart illustrating a method of driving a light emitting display device according to an embodiment of the present disclosure.

FIG. 7 is a flowchart illustrating a method of driving the light emitting display device according to the embodiment of the present disclosure.

Referring to FIG. 7, in a pixel 101, a drive current is supplied to a light emitting diode LED in response to a voltage which is applied to the gate electrode of the first transistor M1.

The pixel 101 is initialized (S700). At this time, the first gate signal GATE1 and the second emission signal EMS2 are switched to the high state and the second transistor M1, the fifth transistor M5, and the sixth transistor M6 are turned on. When the second transistor M2 and the fifth transistor M5 are turned on, the first source voltage EVDD is transmitted to the third node N3. When the sixth transistor M6 is turned on, the initialization voltage Vini is transmitted to the second electrode of the first capacitor Cst and the anode electrode of the light emitting diode LED. Accordingly, the first capacitor Cst and the anode electrode of the light emitting diode LED are initialized.

Since the voltage level of the initialization voltage Vini is lower than the threshold voltage of the light emitting diode LED, the light emitting diode LED does not emit light even when the initialization voltage Vini is applied to the anode electrode of the light emitting diode LED.

A data signal Vdata is written to the pixel 101 (S710). In the pixel 101, when the second gate signal GATE2 is switched to the high state, the data line DL which transmits the data signal Vdata is connected to the second node N2. Accordingly, the data signal Vdata is transmitted to the second node N2.

In the pixel 101, the threshold voltage of the first transistor M1 is sampled (S720). When the first gate signal GATE1 is switched to the high state in a state in which the data line DL is connected to the second node N2, the second transistor M2 is turned on and the third node N3 is connected to the second node N2 via the first node N1. Accordingly, a current flows from the third node N3 to the data line DL due to the voltage stored in the third node N3 and the data signal Vdata applied to the data line DL, and a voltage corresponding to Expression 1 is applied to the third node N3.

Accordingly, the data signal Vdata and a voltage corresponding to the threshold voltage of the first transistor M1 are stored in the third node N3.

The light emitting display device 100 emits light by supplying the drive current to the light emitting diode LED in the pixel 101 (S730). After the data signal Vdata and the voltage corresponding to the threshold voltage of the first transistor M1 are stored in the third node N3, the fourth transistor M4 and the fifth transistor M5 are sequentially turned on. Accordingly, the drive current flowing in the light emitting diode LED is compensated for by the threshold voltage.

In order to prevent the voltage of the third node N3 from floating, the constant voltage source supplying a DC voltage (e.g., the first voltage source EVDD) is capacitively coupled to the third node N3. That is, while Steps S700 to S730 are being performed, the constant voltage source is capacitively coupled to the third node N3.

Accordingly, it is possible to prevent the voltage level of the third node N3 from fluctuating due to a kickback phenomenon which occurs due to turning-on/off of the transistors. In order to capacitively couple the constant voltage source to the third node N3, the second capacitor Cst2 is disposed between the third node N3 and the constant voltage source.

At least the second transistor M2 out of the first to sixth transistors M1 to M6 includes oxide semiconductor. When the second transistor M2 includes oxide semiconductor, it is possible to curb flowing of a leakage current in the second transistor M2 and thus to curb a decrease in voltage level stored in the first capacitor Cst1 and/or the second capacitor Cst2.

While embodiments of the present disclosure have been described above in detail with the accompanying drawings, the present disclosure is not limited to the embodiments and can be modified in various forms without departing from the technical idea of the present disclosure. Accordingly, the embodiments of the present disclosure are not for defining the technical idea of the present disclosure but for describing the technical idea, and the scope of the technical idea of the present disclosure is not limited to the embodiments. The embodiments described above should be construed to be exemplary but not definitive in all respects. The scope of the present disclosure is defined by the appended claims and all technical ideas within the scope equivalent thereto should be construed to belong to the scope of the present disclosure.

What is claimed is:

1. A pixel circuit comprising:
a first transistor having:
a first electrode connected to a first node which is coupled to a first power supply line supplying a first source voltage,
a second electrode connected to a second node, and
a gate electrode connected to a third node;
a second transistor having:
a first electrode directly connected to the first node,
a second electrode connected to the third node, and
a gate electrode connected to a first gate line;
a light emitting diode coupled to the first transistor;
a first capacitor having:
a first electrode connected to the third node, and
a second electrode connected to a conductive line and an anode electrode of the light emitting diode, the conductive line coupled to a second power supply line supplying an initialization voltage; and
a second capacitor having:
a first electrode connected to the third node, and
a second electrode connected to a constant voltage source which supplies a DC voltage.

2. The pixel circuit according to claim 1, wherein the second transistor includes an oxide semiconductor.

3. The pixel circuit according to claim 1, wherein the second electrode of the second capacitor is connected to the first power supply line supplying the first source voltage.

4. The pixel circuit according to claim 1, wherein the second capacitor prevents a voltage of the third node from fluctuating due to a kickback phenomenon which occurs when the second transistor is turned on or turned off.

5. The pixel circuit according to claim 1, further comprising:
a third transistor having:
a first electrode connected to the second node,
a second electrode is connected to a data line, and
a gate electrode connected to a second gate line;
a fourth transistor having:
a first electrode connected to the second node,
a second electrode connected to the light emitting diode, and
a gate electrode connected to a first emission line;
a fifth transistor having:
a first electrode supplied with the first source voltage,
a second electrode connected to the first node, and
a gate electrode connected to a second emission line; and
a sixth transistor having:
a first electrode supplied with the initialization voltage,
a second electrode connected to the conductive line, and
a gate electrode connected to the first gate line.

6. The pixel circuit according to claim 5, wherein the pixel circuit operates separately in:
an initialization period in which the fifth transistor is switched to an ON state, then the second transistor and the sixth transistor are switched to an ON state, and the third transistor and the fourth transistor are maintained in an OFF state;
a writing period in which the second transistor, the sixth transistor and the fifth transistor are switched to the OFF state, the third transistor is switched to the ON state, and the fourth transistor is maintained in the OFF state;
a sampling period in which the second transistor and the sixth transistor are switched to the ON state, the third transistor is maintained in the ON state, and the fourth transistor and the fifth transistor are maintained in the OFF state; and
an emission period in which the second transistor, the sixth transistor, and the third transistor are switched to the OFF state and then the fourth transistor and the fifth transistor are sequentially switched to the ON state.

7. The pixel circuit according to claim 6,
wherein, in the initialization period, a voltage corresponding to the first source voltage is stored in the third node by the first capacitor, and
wherein, in the sampling period, a voltage corresponding to a data signal supplied by the data line and a voltage corresponding to a threshold voltage of first transistor are stored in the third node by the first capacitor.

8. A light emitting display device comprising:
a display panel that includes a plurality of data lines, a plurality of gate lines, a plurality of emission lines, and a plurality of pixels which are connected to the plurality of data lines, the plurality of gate lines, and the plurality of emission lines;
a data driver that supplies a data signal to the plurality of data lines;
a gate driver that supplies a gate signal to the plurality of gate lines and supplies an emission signal to the plurality of emission lines; and
a timing controller that controls the data driver and the gate driver,
wherein each pixel includes:
a first transistor having:
a first electrode connected to a first node which is coupled to a first power supply line supplying a first source voltage,
a second electrode connected to a second node, and
a gate electrode connected to a third node,
a second transistor having:
a first electrode directly connected to the first node,
a second electrode connected to the third node, and
a gate electrode connected to a first gate line,
a light emitting diode coupled to the first transistor,
a first capacitor having:
a first electrode connected to the third node, and
a second electrode connected to a conductive line and an anode electrode of the light emitting diode, the conductive line coupled to a second power supply line supplying an initialization voltage, and
a second capacitor having:
a first electrode connected to the third node, and
a second electrode connected to a constant voltage source which supplies a DC voltage.

9. The light emitting display device according to claim 8, wherein the second transistor includes an oxide semiconductor.

10. The light emitting display device according to claim 8, wherein the second electrode of the second capacitor is connected to the first power supply line supplying the first source voltage.

11. The light emitting display device according to claim 8, wherein the second capacitor prevents a voltage of the third node from fluctuating due to a kickback phenomenon which occurs when the second transistor is turned on or turned off.

12. The light emitting display device according to claim 8, wherein each pixel further includes:
a third transistor having:
a first electrode connected to the second node,
a second electrode connected to the data line, and
a gate electrode connected to a second gate line;
a fourth transistor having:
a first electrode connected to the second node,
a second electrode connected to the light emitting diode, and
a gate electrode connected to a first emission line;
a fifth transistor having:
a first electrode supplied with the first source voltage,
a second electrode connected to the first node, and
a gate electrode connected to a second emission line; and
a sixth transistor having:
a first electrode supplied with the initialization voltage,
a second electrode connected to the conductive line,
and a gate electrode is connected to the first gate line.

13. The light emitting display device according to claim 12, wherein each pixel operates separately in:
an initialization period in which the fifth transistor is switched to an ON state, then the second transistor and the sixth transistor are switched to an ON state, and the third transistor and the fourth transistor are maintained in an OFF state;
a writing period in which the second transistor, the sixth transistor and the fifth transistor are switched to the OFF state, the third transistor is switched to the ON state, and the fourth transistor is maintained in the OFF state;
a sampling period in which the second transistor and the sixth transistor are switched to the ON state, the third transistor is maintained in the ON state, and the fourth transistor and the fifth transistor are maintained in the OFF state; and
an emission period in which the second transistor, the sixth transistor, and the third transistor are switched to the OFF state and then the fourth transistor and the fifth transistor are sequentially switched to the ON state.

14. The light emitting display device according to claim 13,
wherein the gate driver supplies a first gate signal to the first gate line, a second gate signal to the second gate line, a first emission signal to the first emission line, and a second emission signal to the second emission line,
wherein, in the initialization period, the first gate signal is switched from a low state to a high state, the second gate signal is maintained in the low state, the first emission signal is switched from the high state to the low state, and the second emission signal is maintained in the high state,
wherein, in the writing period, the first gate signal is maintained in the low state, the second gate signal is switched from the low state to the high state, and the first emission signal and the second emission signal are maintained in the low state,
wherein, in the sampling period, the first gate signal and the second gate line are sequentially switched from the high state to the low state, and the first emission signal and the second emission signal are maintained in the low state, and
wherein, in the emission period, the first gate signal and the second gate signal are maintained in the low state, and the first emission signal and the second emission signal are sequentially switched to the high state.

15. The light emitting display device according to claim 13,
wherein, in the initialization period, a voltage corresponding to the first source voltage is stored in the third node by the first capacitor, and
wherein, in the sampling period, a voltage corresponding to the data signal and a voltage corresponding to a threshold voltage of first transistor are stored in the third node by the first capacitor.

16. A light emitting display device comprising:
a substrate;
a semiconductor layer that is disposed on the substrate;
a gate insulating film that is disposed on the semiconductor layer;
a gate electrode that is disposed to overlap the semiconductor layer on the gate insulating film;
an interlayer insulating film that is disposed on the gate electrode;
a first power supply line that is disposed on the interlay insulating film and supplies a first source voltage, at least a part of the first power supply line overlapping the gate electrode;
a source electrode that is disposed on the interlayer insulating film and is in contact with the semiconductor layer via a first contact hole;
a drain electrode that is disposed on the interlayer insulating film and is in contact with the semiconductor layer via a second contact hole;
a protection layer that is disposed on the first power supply line, the source electrode, and the drain electrode; and
a conductive film that is disposed on the protection layer, at least a part of the conductive film overlapping the gate electrode.

17. The light emitting display device according to claim 16, further comprising:
a light emitting diode that includes an anode electrode, a cathode electrode, and a light emitting layer disposed between the anode electrode and the cathode electrode,
wherein the anode electrode of the light emitting diode is connected to the conductive film.

18. A method of driving a light emitting display device including a plurality of pixels, in each of the pixels, a drive current is supplied to a light emitting diode in response to a voltage which is applied to a gate electrode of a first transistor, the method comprising:
initializing the pixel;
writing a data voltage to the pixel;
sampling a threshold voltage of the first transistor; and
supplying the drive current to the light emitting diode,
wherein the gate electrode of the first transistor is capacitively coupled to a constant voltage source that supplies a DC voltage,
wherein a first electrode of the first transistor is connected to a first node which is coupled to a first power supply line supplying a first source voltage, wherein a second electrode of the first transistor is connected to a second node, and wherein the gate electrode of the first transistor is connected to a third node,
wherein the light emitting display device further includes:
a second transistor having:
a first electrode directly connected to the first node,
a second electrode connected to the third node, and
a gate electrode connected to a first gate line;
a first capacitor having:
a first electrode connected to the third node, and
a second electrode connected to a conductive line and an anode electrode of the light emitting diode, the conductive line coupled to a second power supply line supplying an initialization voltage; and
a second capacitor having:
a first electrode connected to the third node, and
a second electrode connected to the constant voltage source which supplies the DC voltage.

19. The method according to claim 18,
wherein the pixel is driven in response to supply of a first gate signal, a second gate signal, a first emission signal, and a second emission signal,
wherein, in the initializing of the pixel, the first gate signal is switched from a low state to a high state, the second gate signal is maintained in the low state, the first emission signal is switched from the high state to the low state, and the second emission signal is maintained in the high state,
wherein, in the writing of the data voltage to the pixel, the first gate signal is maintained in the low state, the second gate signal is switched from the low state to the high state, and the first emission signal and the second emission signal are maintained in the low state,
wherein, in the sampling of the threshold voltage, the first gate signal and the second gate signal are sequentially switched from the high state to the low state, and the first emission signal and the second emission signal are maintained in the low state, and
wherein, in the supplying of the drive current, the first gate signal and the second gate signal are maintained in the low state, and the first emission signal and the second emission signal are sequentially switched to the high state.

20. The method according to claim 18, wherein the second electrode of the second capacitor is connected to the first power supply line supplying the first source voltage.

21. The method according to claim 18, wherein the second capacitor prevents a voltage of the third node from fluctuating due to a kickback phenomenon which occurs when the second transistor is turned on or turned off.

22. The method according to claim 18,
 wherein, in the initialization of the pixel, a voltage corresponding to the first source voltage is stored in the third node by the first capacitor, and
 wherein, in the sampling of the threshold voltage, a voltage corresponding to the data voltage and a voltage corresponding to the threshold voltage of first transistor are stored in the third node by the first capacitor.

* * * * *